(12) United States Patent
Monshouwer et al.

(10) Patent No.: US 6,937,334 B2
(45) Date of Patent: Aug. 30, 2005

(54) METHOD OF MEASURING ALIGNMENT OF A SUBSTRATE WITH RESPECT TO A REFERENCE ALIGNMENT MARK

(75) Inventors: Rene Monshouwer, Eindhoven (NL); Jacobus Hermanus Maria Neijzen, Eindhoven (NL); Jan Evert Van Der Werf, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 567 days.

(21) Appl. No.: 09/940,819

(22) Filed: Aug. 28, 2001

(65) Prior Publication Data

US 2002/0080365 A1 Jun. 27, 2002

(30) Foreign Application Priority Data

Dec. 27, 2000 (EP) .............................. 00204825

(51) Int. Cl.[7] .......................... G01B 11/00; G01B 11/02
(52) U.S. Cl. ...................... 356/399; 356/509; 356/401
(58) Field of Search ............................. 356/496, 508, 356/509, 399–401; 355/53, 55; 430/5, 22, 30; 250/548

(56) References Cited

U.S. PATENT DOCUMENTS

| 4,251,160 A | 2/1981 | Bouwhuis et al. ............ 356/401 |
| 4,356,392 A | 10/1982 | Wittekoek et al. ............ 250/201 |
| 4,540,277 A | 9/1985 | Mayer et al. ................... 355/53 |
| 4,737,823 A | 4/1988 | Bouwer et al. ................ 355/53 |
| 4,778,275 A | 10/1988 | Van den Brink ............. 356/401 |
| 4,861,162 A | 8/1989 | Ina et al. ....................... 356/401 |
| 5,026,166 A | 6/1991 | Van der Werf .............. 356/401 |
| 5,144,363 A | 9/1992 | Wittekoek et al. ............. 355/53 |
| 5,191,200 A | 3/1993 | Van der Werf .............. 250/201 |
| 5,243,195 A | 9/1993 | Nishi ........................... 250/548 |
| 5,252,414 A * | 10/1993 | Yamashita et al. ............ 430/22 |
| 5,402,224 A * | 3/1995 | Hirukawa et al. .......... 356/124 |
| 5,414,514 A | 5/1995 | Smith et al. ................. 356/363 |
| 5,808,742 A * | 9/1998 | Everett et al. .............. 356/509 |
| 6,278,116 B1 * | 8/2001 | Wu .............................. 250/365 |
| 6,727,989 B1 * | 4/2004 | Yin et al. .................... 356/400 |

FOREIGN PATENT DOCUMENTS

| EP | 0498499 A1 | 8/1992 |
| WO | 9839689 A1 | 9/1998 |

OTHER PUBLICATIONS

"Submicrometer Lithographic Alignment and Overlay Strategies", by Saleem H. Zaidi et al, SPIE vol. 1343, 1990, pp. 245–255.

"Submicron 1:1 Optical Lighography", by David A. Markle, Semiconductor International May 1986.

* cited by examiner

*Primary Examiner*—Zandra V. Smith
*Assistant Examiner*—Gordon J. Stock, Jr.
(74) *Attorney, Agent, or Firm*—Pillsbury Winthrop Shaw Pittman LLP

(57) ABSTRACT

For determining the alignment of a substrate with respect to a mask, a substrate alignment mark having a periodic structure, and an additional alignment mark, having a periodic structure and provided in a resist layer (RL) on top of the substrate, are used. Upon illumination of these two marks, having a period which is considerably smaller than that of a reference mark, an interference pattern (Pb) is generated, which has a period corresponding to that of the reference mark. By measuring the movement of the interference pattern with respect to the reference mark, the much smaller mutual movement of the fine alignment marks can be measured. In this way, the resolution and accuracy of a conventional alignment device can be increased considerably.

10 Claims, 5 Drawing Sheets

METHOD OF MEASURING ALIGNMENT OF A SUBSTRATE WITH RESPECT TO A REFERENCE ALIGNMENT MARK

RELATED APPLICATION

This application claims the benefits of priority to European Patent Application No. 00204825.4, filed Dec. 27, 2000, the contents of which are herein incorporated by reference.

The invention relates to a method of measuring alignment of a substrate, provided with at least one substrate alignment mark having a periodic structure, with respect to a reference alignment mark having a periodic structure, prior to imaging a mask pattern in a resist layer on the substrate, which method comprises the steps of:

illuminating a substrate alignment mark with an alignment beam and imaging this mark on a reference alignment mark, and determining the intensity of alignment radiation from the reference alignment mark.

The invention also relates to a method of manufacturing devices by means of a lithographic projection apparatus, which method comprises the method of measuring alignment.

The lithographic projection apparatus is an essential tool in the manufacture of integrated circuits (ICs) by means of diffusion and masking techniques. By means of this apparatus, a number of masks having different mask patterns are successively imaged at the same position on a semiconductor substrate. The substrate must undergo the desired physical and chemical changes between the successive projections of the different mask patterns. To this end, the substrate must be removed from the apparatus after it has been exposed with a mask pattern. After it has undergone the desired process steps, the substrate must again be placed at the same position in the apparatus so as to expose it with a second mask pattern, and so forth. It must then be ensured that the second and subsequent mask patterns are positioned accurately with respect to device structures already formed in the substrate. To this end, the lithographic projection apparatus is provided with an alignment system with which alignment marks on the substrate are aligned with respect to alignment marks on the mask. This alignment system comprises an optical alignment-measuring device for measuring alignment deviations.

Alignment of a substrate with respect to a mask may be measured by means of the so-called on-axis method, in which a substrate alignment mark is directly imaged on a mask alignment mark via the projection lens of the apparatus. This method is also known as the through-the-lens (TTL-) method. The alignment may also be measured by means of the off-axis method, in which a substrate alignment mark is imaged on a reference alignment mark outside the field of the projection system of the apparatus. In a very promising embodiment of the off-axis method, a substrate alignment mark is aligned with respect to an alignment mark on the substrate holder via a reference mark which is arranged outside the projection column. During this first alignment step, the substrate holder with the substrate is positioned outside the projection column. After the first alignment step has been performed, the substrate holder is positioned in the projection column, and in a second alignment step the substrate alignment mark is imaged on a mask alignment mask via the projection lens.

A lithographic projection apparatus may not only be used for the manufacture of ICs but also for the manufacture of other structures having structure details of the order of 1 $\mu$m and smaller. Examples are structures of integrated, or planar, optical systems, guiding and detection patterns of magnetic domain memories, structures of liquid crystal display panels and magnetic heads. Also in the manufacture of these structures, images of mask patterns must be aligned very accurately with respect to a substrate.

The lithographic projection apparatus may be a stepping apparatus or a step-and-scan apparatus. In a stepping apparatus, the mask pattern is imaged in one run on an IC area of the substrate. Subsequently, the substrate is moved with respect to the mask in such a way that a subsequent IC area will be situated under the mask pattern and the projection lens system and the mask pattern is imaged on the subsequent IC area. This process is repeated until all IC areas of the substrate are provided with a mask pattern image. In a step-and-scan apparatus, the above-mentioned stepping procedure is also followed, but the mask pattern is not imaged in one run but via scanning movement. During imaging of the mask pattern, the substrate is moved synchronously with the mask with respect to the projection system and the projection beam, taking the magnification of the projection system into account. A series of juxtaposed partial images of consecutively exposed parts of the mask pattern is imaged in an IC area. After the mask pattern has been completely imaged in an IC area, a step is made to a subsequent IC area. A possible scanning procedure is described in the article: "Sub-micron 1:1 Optical Lithography" by D. A. Markle in the magazine "Semiconductors International" of May 1986, pp. 137–142.

U.S. Pat. No. 4,251,160 discloses an optical lithographic projection apparatus intended for the manufacture of ICs and provided with a single on-axis alignment unit. The substrate and mask alignment marks are gratings. A double on-axis alignment unit for aligning a first and a second substrate alignment mark with respect to a first and a second mask alignment mark, respectively, is disclosed in U.S. Pat. No. 4,778,275. Patent application WO 98/39689 discloses an off-axis alignment unit and U.S. Pat. No. 5,243,195 discloses an alignment system comprising both an on-axis alignment unit and an off-axis alignment unit.

The above-mentioned alignment methods and units have hitherto worked to full satisfaction, but it is to be expected that these methods may present problems with regard to accuracy and reliability when the structure details, or line widths, decrease and when novel technologies are used in the IC manufacture.

In connection with the increasing number of electronic components per unit of surface area of ICs and the resultant smaller dimensions of these components, increasingly stricter requirements are imposed on the accuracy with which integrated circuits are made. The positions where the successive mask patterns are imaged on the substrate must therefore be controlled more and more accurately. In the manufacture of new-generation ICs with smaller line widths, the alignment accuracy will have to be improved or, in other words, it must be possible to detect smaller alignment deviations so that the resolving power of the alignment system must be increased.

Stricter requirements must also be imposed on the planeness of the substrate due to the required higher numerical aperture (NA) of the projection system in the case of decreasing line widths. The depth of focus of the projection system decreases as the NA increases. Since some image field curvature occurs at the desired large image field of the projection system, there is hardly any room left for unevenness of the substrate. To obtain a substrate that is sufficiently plane, it has been proposed to polish the substrate by means of the chemical mechanical polishing (CMP) process between two consecutive exposures with different mask patterns in the projection apparatus. However, this polishing process affects the accuracy of the on-axis alignment method.

Furthermore, the manufacturing process for the new-generation ICs is becoming more and more complicated; the number of process steps and the number of process layers on the substrate increase more and more. Some of these layers also introduce asymmetries in the substrate grating alignment mark and hence cause alignment errors.

It is an object of the present invention to provide a method of measuring alignment of a substrate with respect to a reference, as mentioned in the opening paragraph, which method is more accurate and reliable than known methods and provides an alignment signal which is less sensitive to said effects. To this end, the method is characterized by the steps of:

using a substrate alignment mark having a periodic structure with a period $p_1$ which is substantially smaller than the period of the reference alignment mark;

providing the resist layer with an additional alignment mark having a periodic structure with a period $p_2$ such that, upon illumination by the alignment beam of the substrate alignment mark and the additional alignment mark, an interference pattern is generated having a period which is substantially equal to the period of the reference alignment mark, and imaging the interference pattern on the reference alignment mark.

A substrate is to be understood to mean a plate of material, for example silicon, into which a complete device, such as an IC is to be formed level-wise by means of a number of successive sets of processing steps. Each of these sets comprises as main processing steps: applying a resist layer on the substrate, aligning the substrate with a mask, imaging the pattern of this mask in the resist layer, developing the resist layer, etching the substrate via the resist layer and further cleaning and other processing steps. The term substrate covers substrates at different stages in the device-manufacturing process, i.e. both a substrate having only one layer of device features and a substrate having all but one layer of device features, and all intermediate substrates. All of these substrates have in common that they are provided with at least one alignment mark which is visible to the alignment beam.

The periods $p_1$ and $p_2$ of the substrate alignment mark and the additional alignment mark, respectively, are preferably of the order of the resolving power of the projection system and much smaller than the period of a conventional substrate alignment mark. Because of the smaller periods, smaller alignment errors can be measured with the new method. The period of the interference pattern, or Moiré pattern, is determined by the periods of the substrate and additional alignment marks. By proper choice of the periods $p_1$ and $p_2$, the period of the interference pattern can be made equal to the period of a conventional substrate alignment mark so that the method can be carried out with a conventional alignment system. The actual alignment errors or magnified by the new method and a small alignment error results in a considerably larger displacement of the interference pattern with respect to the reference alignment mark and in a considerable change in the alignment signal from the alignment unit. This means that less interpolation of the alignment signal is needed and that a considerably more accurate measurement becomes possible. As the alignment signal provided by the new method is an averaged signal over a relatively large area, this signal is less sensitive to local surface deformations.

It is to be noted that U.S. Pat. No. 5,414,514 discloses the use of an interference pattern to measure the alignment of two plates, which pattern is obtained when superposed first and second grating alignment marks having periods $p_1$ and $p_2$, respectively, are illuminated. The first alignment mark is a substrate alignment mark. However, the second alignment mark is a wafer alignment mark and not an additional alignment mark in a layer on the substrate. The interference pattern is not imaged on a reference alignment mark but on a CCD sensor. The substrate and the mask are separated by only a small gap and the mask pattern is imaged on the substrate, not by a projection system but by a proximity printing process using X-rays.

The article: "Submicrometer lithographic alignment and overlay strategies" in SPIE, Vol. 1343, X-ray/EUV Optics for Astronomy, Microscopy, Polarimetry and Projection Lithography" (1990) pp.245–255 states that Moiré techniques may be an effective technique for alignment and overlay registration in photolithography. This article discusses only how two gratings having slightly different grating periods or grating line orientations form a Moiré pattern. It does not enter into the alignment method itself and neither discloses that the resolving power and accuracy of a conventional alignment system can be increased considerably by the Moiré technique.

For determining the mutual shift of the substrate alignment mark and the additional alignment mark from the position of the image of the interference pattern with respect to the reference alignment mark, a further reference mark is needed. An embodiment of the measuring method, wherein such a further reference mark is used, is characterized in that use is made of a substrate reference alignment mark having substantially the same period as the interference pattern, the substrate reference alignment mark is imaged on the reference alignment mark, and the difference between the positions of the image of the interference pattern and that of the substrate reference alignment mark with respect to the reference alignment mark is determined. Said difference between the positions is a measure of the shift between the substrate alignment grating and the additional alignment grating. The substrate reference mark may be constituted by a substrate global alignment mark.

The alignment marks used with the measuring method may have different structures, provided that they are periodic. The so-called Siemens star is such a periodic alignment mark that is already used in the optical lithography technique.

Preferably, the method is characterized in that use is made of gratings for the substrate alignment mark, the additional alignment mark and the reference alignment mark.

Grating structures have proved to be very suitable as alignment marks.

The additional alignment mark is formed in the resist layer by imaging a corresponding mark provided on the mask outside the mask pattern in the resist layer by means of the lithographic apparatus. The area of the substrate layer where the mark image is located may be developed and the developed mark image may be used for carrying out the measuring method. Preferably, the method is characterized in that the additional alignment mark is a latent mark.

A latent mark is understood to mean a latent, or non-developed, image of an alignment mark. A resist layer with such a latent image comprises areas, which are linear areas in the case of a grating mark, which have a different phase effect on an incident beam than their surroundings. These effects are due to the intensity variations in the beam that images the mark, which variations cause local changes of the refractive index in the layer and local shrinkage of this layer. Due to these phase effects, the latent alignment mark is discernible by the alignment beam. The advantage of using a latent alignment mark is that the substrate with the mark image in the resist layer does not need to be removed from the lithographic apparatus for developing this image.

If a latent additional alignment mark is used, a second aspect of the invention can be realized. This aspect relates to a new method of aligning a substrate with respect to a mask, which method uses a global alignment-measuring method of measuring the position of a global substrate alignment mark with respect to a global reference alignment mark. This method is characterized by the steps of:

providing a substrate with a substrate reference alignment mark and with a substrate fine alignment mark having a period which is substantially smaller than that of the substrate reference alignment mark, which substrate is covered with a resist layer;

aligning the substrate reference alignment mark with respect to a non-substrate reference alignment mark, using a coarse alignment-measuring method;

providing the resist layer with an additional alignment mark having a period of the same order as that of the substrate fine alignment mark;

measuring the alignment of the substrate fine alignment mark with respect to the additional alignment mark by illuminating these two marks and imaging the resulting interference pattern on the non-substrate reference alignment mark, and using the measuring signal of this measurement to correct the signal obtained with the coarse alignment method.

The substrate reference alignment mark may be a global alignment mark or an alignment mark belonging to an IC area of the substrate. The non-substrate reference alignment mark may be a mask global alignment mark or a mark outside the mask. A global alignment mark is understood to mean a conventional periodic alignment mark for aligning a substrate as such with respect to a reference alignment mark such as a mask alignment mark. The period of the global alignment mark is substantially larger than the resolution limit of the projection system by means of which the global substrate alignment mark is imaged on the wafer alignment mark, which, in principle, is a global alignment mark.

The invention may be implemented in different ways resulting in different embodiments of the measuring method. A first embodiment is characterized in that it is based on the on-axis alignment principle.

In this embodiment, the interference pattern is imaged on a mask alignment mark by means of the projection system that is intended for projecting mask patterns onto the substrate.

This embodiment is preferably further characterized in that the interference pattern is imaged on a mask alignment mark via an optical filter, which selects diffraction orders of the radiation from the substrate alignment marks to proceed to said mask alignment mark.

This optical filter, or diaphragm, prevents noise radiation caused, for example, by false reflection at components in the apparatus, from reaching the detector. By selecting, for example, only the first diffraction orders for imaging the interference pattern on the mask alignment mark, the accuracy of the alignment measurement can be increased by a factor of two.

A second embodiment of the method is characterized in that it is based on the off-axis alignment principle.

The interference pattern is imaged on a reference alignment mark forming part of an off-axis alignment device that is located next to the projection lens. With this device, a number of diffraction orders of the alignment radiation from the substrate, for example the first to the seventh order, can be detected separately. The mask is also aligned with respect to the off-axis alignment device, so that the substrate and the mask are aligned in an indirect, or two-step, way. An advantage of this off-axis alignment method is that it is largely insensitive to CMP process parameters.

An off-axis alignment is performed also in lithographic projection apparatus having two substrate stages and a separate measuring station in addition to the projection station. During projection of a mask pattern on a first substrate in the projection station, the position of a second substrate is measured in the measuring station. An embodiment of such apparatus, wherein two substrate stages commute between the measuring station and the projection station, is shown in U.S. Pat. No. 4,861,162. Such apparatus has the advantage that its throughput, i.e. the number of substrates that can be processed per time unit, is considerably larger than that of a comparable apparatus having only a projection station and no measuring station. The alignment measuring method of the present invention may be used in the measuring station.

This invention also relates to a method of manufacturing devices in at least one layer of a substrate, which method comprises at least one set of the following successive steps:

aligning a mask provided with a mask pattern comprising pattern features corresponding to a device feature to be configured in said layer;

imaging, by means of projection radiation, the mask pattern in a radiation sensitive layer on the substrate, and removing material from, or adding material to, areas of said layer and substrate, which areas are delineated by the mask pattern image. This method is characterized in that the alignment is carried out by means of the alignment-measuring method as described herein before.

These and other aspects of the invention are apparent from and will be elucidated, by way of non-limitative example, with reference to the embodiments described hereinafter.

Figure 1:
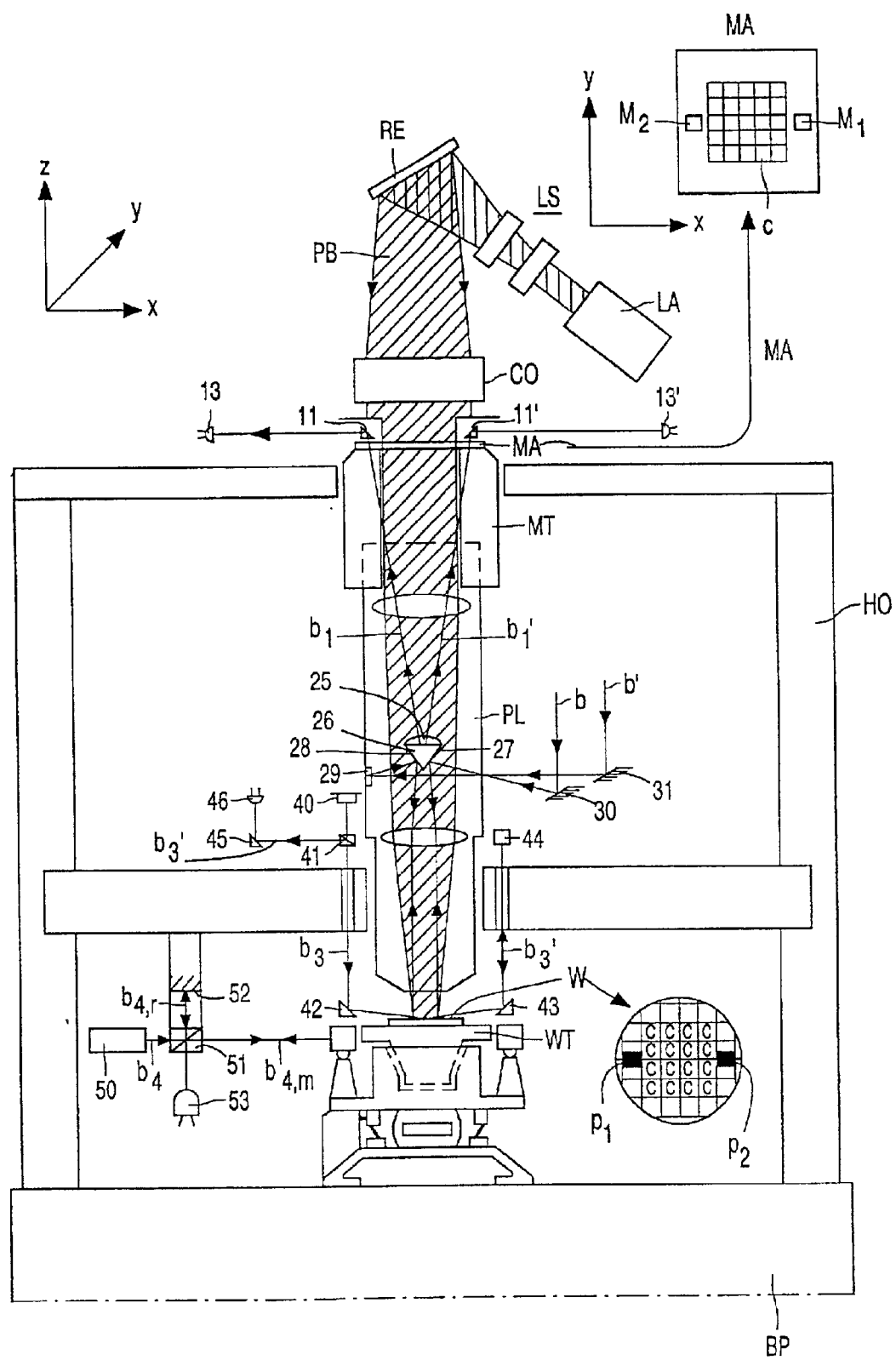
FIG. 1 shows an embodiment of a lithographic projection apparatus for repetitively imaging a mask pattern on a substrate.

FIG. 1 shows the principle and an embodiment of a lithographic projection apparatus for repetitively imaging a mask pattern on a substrate. The main components of this apparatus are a projection column, in which a mask MA provided with a mask pattern C to be imaged is arranged, and a movable substrate table WT, by means of which the substrate W can be positioned with respect to the mask pattern. The apparatus further comprises an illumination unit, which consists of a radiation source LA, for example a Krypton-Fluoride laser, a lens system LS, a reflector RE and a condenser lens CO. The projection beam PB supplied by the illumination unit illuminates the mask pattern C present in the mask MA which is arranged on a mask holder (not shown) in the mask table MT.

The projection beam PB passing through the mask pattern C traverses a projection lens system PL arranged in the projection column and shown only diagrammatically. This projection system forms an image of the pattern C successively in each of the IC areas, or substrate fields, of the substrate W. The projection lens system has, for example a magnification M of ¼, a numerical aperture of the order of 0.5, or larger, and a diffraction-limited image field with a diameter of the order of 0.25. These numbers are arbitrary and may vary with every new generation of the projection apparatus. The substrate W is arranged in a substrate holder (not shown) which forms part of a substrate table WT supported in, for example, air bearings. The projection lens system PL and the substrate table WT are arranged in a housing HO which is closed at its lower side by a base plate BP of, for example granite, and at its upper side by the mask table MT.

As is shown in the top right-hand corner of FIG. 1, the mask has two alignment marks $M_1$ and $M_2$. These marks preferably consist of diffraction gratings, but they may be alternatively formed by other periodic structures. The alignment marks are preferably two-dimensional, i.e. they extend in two mutually perpendicular directions, the X and Y directions in FIG. 1. The substrate W, for example a semi-conductor substrate or wafer, comprises a plurality of alignment marks, preferably also two-dimensional diffraction gratings, two of which $P_1$ and $P_2$, are shown in FIG. 1. The marks $P_1$ and $P_2$ are located outside the substrate fields where the images of the mask pattern must be formed. The substrate alignment marks $P_1$ and $P_2$ are preferably formed as phase gratings and the mask alignment marks $M_1$ and $M_2$ are preferably formed as amplitude gratings.

Figure 2:
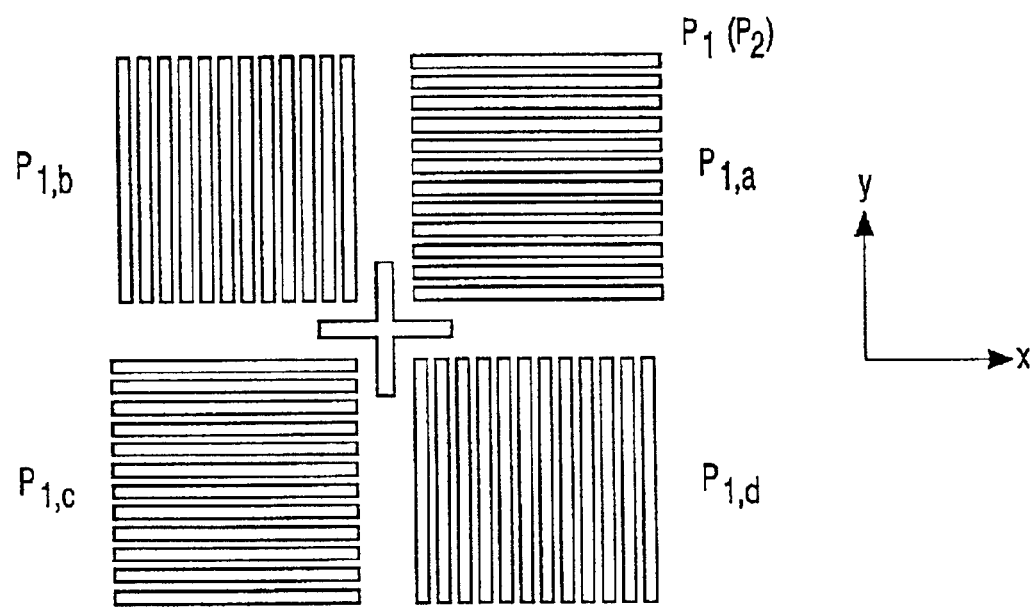
FIG. 2 shows an embodiment of a global substrate alignment mark.

FIG. 2 shows one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for measuring alignment in the X direction and the two other sub-gratings, $P_{1,a}$ and $P_{1,c}$ are used for measuring alignment in the Y direction. The two sub-gratings $P_{1,b}$ and $P_{1,c}$ have a grating period of, for example, 16 $\mu$m and the sub-gratings $P_{1,a}$ and $P_{1,d}$ have a grating period of, for example, 17.6 $\mu$m. Each sub-grating may cover a surface area of, for example, 200×200 $\mu$m². An alignment accuracy which, in principle, is less 0.1 $\mu$m can be achieved with these grating marks and a suitable optical system. Different grating periods for the sub-gratings have been chosen so as to increases the capture range of the alignment-measuring device.

FIG. 1 shows a first embodiment of an alignment-measuring device, namely a double alignment-measuring device. In this device, two alignment beams b and b' are used for measuring the alignment of the substrate alignment mark $P_2$ with respect to the mask alignment mark $M_2$, and the substrate alignment mark $P_1$ with respect to the mask alignment mark $M_1$, respectively. The alignment-measuring beam b is reflected to the reflective surface 27 of a prism 26 by means of a reflective element 30, for example, a mirror. The surface 27 reflects the beam b to the substrate alignment mark $P_2$ which sends a part of the radiation as beam $b_1$ to the associated mask alignment mark $M_2$ where an image of the mark $P_2$ is formed. A reflecting element 11, for example a prism, which directs the radiation passed by the mark $M_2$ to a radiation-sensitive detector 13, is arranged above the mark $M_2$.

Figure 3:
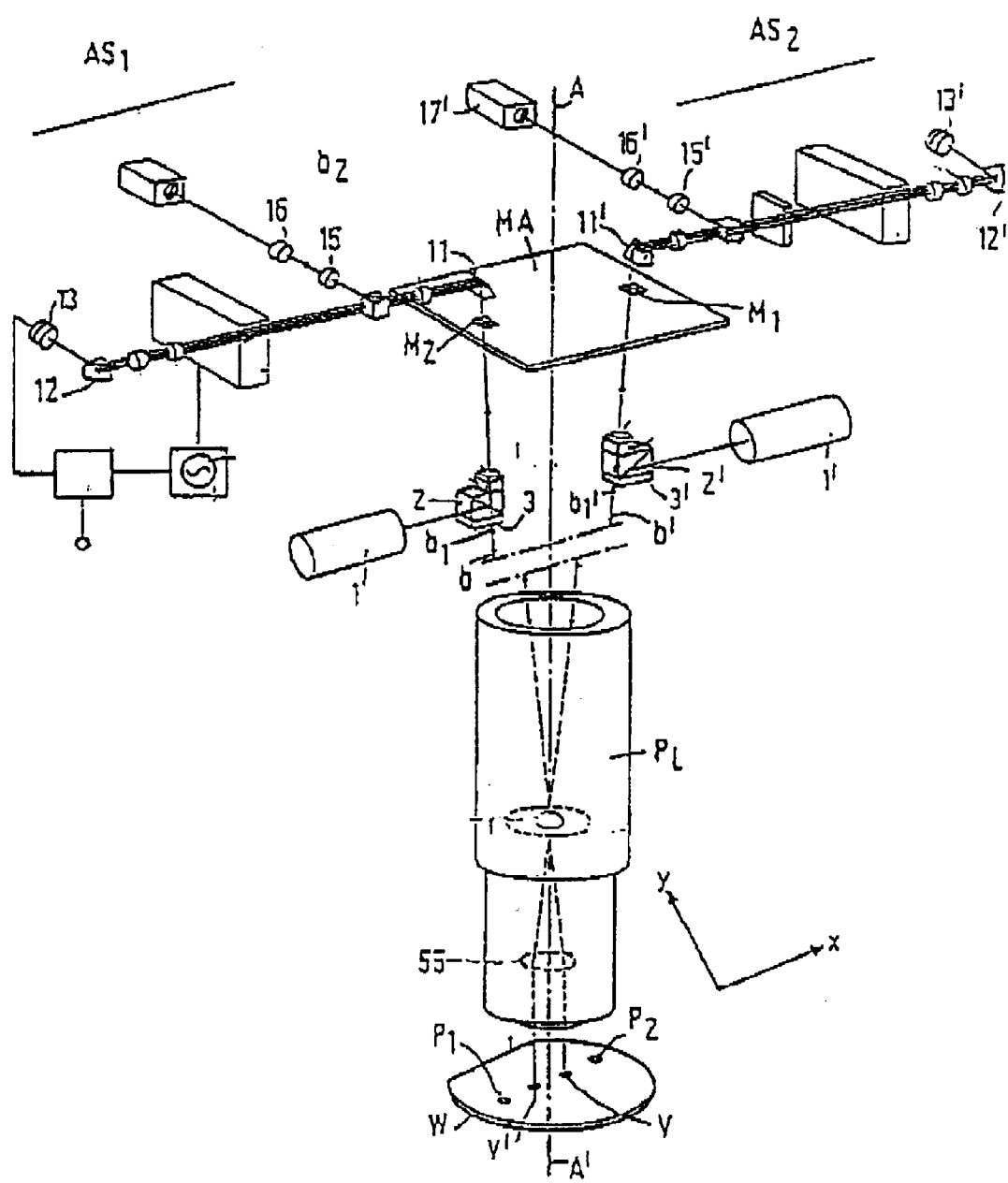
FIG. 3 shows an embodiment of a double alignment-measuring device by means of which the novel alignment method can be performed.

The second alignment-measuring beam b' is reflected to a reflector 29 in the projection lens system PL by a mirror 31. This reflector sends the beam b' to a second reflecting surface 28 of the prism 26, which surface directs the beam b' onto the substrate alignment mark $P_1$. This mark reflects a part of the radiation of the beam b' as a beam $b_1$' to the mask alignment mark $M_1$ where an image of the mark $P_1$ is formed. The radiation of the beam $b_1$' passing through the mark $M_1$ is directed towards a radiation-sensitive detector 13' by a reflector 11'. The operation of the double alignment-measuring device will be further described with reference to FIG. 3 showing a further embodiment of such a device.

The projection apparatus further comprises a focus error detection system for determining a deviation between the image plane of the projection lens system PL and the surface of the substrate W. A measured deviation can be corrected, for example, by moving the projection lens system with respect to the substrate holder along the optical axis of the projection lens system. The focus error detection system may be constituted by the elements 40 to 46, which are arranged in a holder (not shown) which is fixedly connected to the holder of the projection lens system. Element 40 is a radiation source, for example a diode laser, emitting a focus-detection beam $b_3$. This beam is directed to the substrate W at a small angle by a reflecting prism 42. The focus-detection beam reflected by the substrate is directed to a retroreflector 44 by a prism 43. The retroreflector reflects the beam in itself, so that the focus-detection beam once more transverses the same path, now as beam $b_3$', via reflection on the prism 43 to the substrate and from this substrate to the prism 42. The reflected focus-detection beam then reaches a beam splitter 41, which reflects the beam to a further reflector 45. This reflector sends the focus-detection beam to a radiation-sensitive detection system 46. This detection system consists of, for example a position-sensitive detector or of two separate detectors. The position of the radiation spot formed by the beam $b_3$' on this system is dependent on the extent to which the image plane of the projection lens system coincides with the surface of the substrate W. For an extensive description of the focus error detection system, reference is made to U.S. Pat. No. 4,356,392.

Instead of this focus detection system with a monochromatic focus-detection beam, a focus-and-tilt detection system with a broadband beam is preferably used. Such a broadband focus-detection system is described in U.S. Pat. No. 5,191,200.

In order to determine the X and Y positions of the substrate very accurately, the apparatus comprises a composite interferometer system having a plurality of measuring axes, of which only a one-axis sub-system is shown in FIG. 1. This sub-system comprises a radiation source 50, for example a laser, a beam splitter 51, a stationary reference mirror 52 and a radiation-sensitive detector 53. The beam $b_4$ emitted by the source 50 is split by the beam splitter into a measuring beam $b_{4,m}$ and $b_{4,r}$. The measuring beam reaches the measuring mirror in the form of a reflective surface of the substrate table, or preferably a reflective side surface of the substrate holder which forms part of the substrate table and on which the substrate is rigidly secured. The measuring beam reflected by the measuring mirror is combined by the beam splitter 51 with the reference beam reflected by the reference mirror 52 so as to form an interference pattern at the location of the detector 53. The composite interferometer system may be implemented as described in U.S. Pat. No. 4,251,160 and then comprises two measuring axes. The interferometer system may alternatively comprise three measuring axes as described in U.S. Pat. No. 4,737,823, but is preferably a system with at least five measuring axes as described in EP-A 0 498 499.

By making use of a substrate position detection system in the form of a composite interferometer system, the positions of, and the mutual distances between, the alignment marks $P_1$ and $P_2$ and the marks $M_1$ and $M_2$ can be fixed, during alignment, in a system of co-ordinates defined by this interferometer system. Thus it is not necessary to refer to a frame of the projection apparatus or to a component of this frame, so that variations in this frame due to, for example temperature variations, mechanical creep and the like do not affect the measurements.

FIG. 3 shows the principle of the double alignment system with reference to an embodiment which is distinguished from that of FIG. 1 by a different manner of coupling the alignment beams b and b' into the projection lens system. The double alignment device comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the elements of the system $AS_2$ being distinguished by their primed notation.

The structure of the system $AS_1$ as well as the way in which the mutual position of the mask alignment mark $M_2$ and, for example, the substrate alignment mark $P_2$ is determined will now be described first.

The alignment system $AS_1$ comprises a radiation source 1, which emits an alignment beam b. This beam is reflected towards the substrate by a beam splitter 2. The beam splitter may be a partially transparent reflector or a partially transparent prism, but is preferably a polarization-sensitive splitting prism, which is succeeded by a quarter-wavelength plate 3. The projection lens system PL focuses the alignment beam b to a small radiation spot V having a diameter of the order of 1 mm on the substrate W. This substrate reflects a part of the alignment beam as beam $b_1$ in the direction of the mask MA. The beam $b_1$ traverses the projection lens system PL, which system images the radiation spot on the mask. Before the substrate is arranged in the projection column, it has been pre-aligned in a pre-alignment station, for example the station described in U.S. Pat. No. 5,026,166, so that the radiation spot V is located on the substrate alignment mark $P_2$. This mark is then imaged by the beam $b_1$ on the mask alignment mark $M_2$. The dimensions of the mask alignment mark $M_2$ are adapted to that of the substrate alignment mark $P_2$, taking the magnification M of the projection lens into account. The image of the mark P2 then accurately coincides with the mark $M_2$ if the two marks are mutually positioned in the correct manner.

On their paths to and from the substrate W, the alignment-measuring beams b and $b_1$ have traversed twice the quarter-wavelength plate 3 whose optical axis extends at an angle of 45° to the direction of polarization of the linearly polarized beam coming from the source 1. The beam passing through the plate 3 then has its direction of polarization rotated through 90° with respect to that of the beam b, so that the polarization-sensitive prism 2 passes the beam b1. The use of the polarization-sensitive prism in combination with the quarter-wavelength plate provides the advantage of a minimum radiation loss when coupling the alignment-measuring beam into the radiation path of the alignment system.

The beam $b_1$ passed by the alignment mark $M_2$ is reflected by a prism 11 and directed, for example, by a further reflecting prism 12 towards a radiation-sensitive detector 13. This detector is, for example, a composite photodiode having, for example, four separate radiation-sensitive areas in conformity with the number of sub-gratings according to FIG. 2. The output signals of the sub-detectors comprise information about the extent to which the mark $M_2$ coincides with the image of the mark $P_2$. These signals may be processed electronically and used for moving the mask with respect to the substrate by means of driving systems (not shown) so that the image of the substrate alignment mark $P_2$ coincides with the mask alignment mark $M_2$.

A beam splitter 14 splitting a part of the beam $b_1$ into beam $b_2$ may be arranged between prism 11 and the detector 13. The split beam is then incident via, for example, two lenses 15 and 16 on a television camera, which is coupled to a monitor (not shown) on which the alignment marks $P_2$ and $M_2$ are visible to an operator of the lithographic apparatus.

Analogously as described above for the alignment marks $P_2$ and $M_2$, the marks $M_1$ and $P_1$ and $M_1$ and $P_2$, respectively, can be aligned with respect to each other. The alignment-measuring system $AS_2$ is used for the last-mentioned alignments.

The alignment marks $P_1$ and $P_2$ in the form of gratings or other diffraction elements split the alignment-measuring beams incident thereon into a non-deflected zero-order sub-beam and a plurality of, deflected, first-order and higher order sub-beams. Of these sub-beams, only those having the same diffraction order are selected in the alignment-measuring system for imaging a substrate alignment mark on a mask alignment mark. For the selection of the sub-beams, an order diaphragm is arranged in the projection lens system at a position where the sub-beams diffracted in the different diffraction orders are spatially separated to a sufficient extent, for example, in the Fourier plane of the projection system. This order diaphragm is diagrammatically indicated by means of the reference numeral 25 in FIG. 3 and consists of a plate, which is non-transmissive to the alignment-measuring radiation and has a plurality of radiation-transmissive apertures or areas. If the alignment marks have a two-dimensional structure, the plate has four apertures: two for the sub-beams diffracted in the relevant order in the plus and minus X directions and two for the sub-beams diffracted in the relevant order in the plus and minus Y directions. Moreover, an additional order diaphragm improving the selection of the desired order is preferably arranged in the detection branch, i.e. the part of the radiation path from the mask alignment mark to the detector 13, 13'. The sub-beams diffracted in the first orders are preferably used for the alignment.

The smallest alignment error that can be measured with this system and method, i.e. the resolving power of the system, is determined by the grating period, whereby the measurable error can be decreased to a certain degree by interpolation of the alignment signal. The accuracy of the method is limited by the quality of the grating structures. This quality may be affected by local surface deformations of the substrate and by lithographic processing steps, resulting in, for example PICO, RICO and WICO. These artifacts are offsets in the overlay signal caused by the large coherence length of the measuring beam, for example a He—Ne laser beam. Because of the large coherence length, laser radiation that has been affected by optical components in the system may interfere with the desired signal radiation, i.e. radiation of the plus and minus first orders in the described embodiment. The resulting artifacts may be induced by polarization effects of the mask, or reticle (polarization-induced coherence offset: PICO), by the thickness of the reticle (reticle-induced coherence offset: RICO) and by the Z-position of the substrate, or wafer (wafer-induced coherence offset: WICO).

Figure 4:
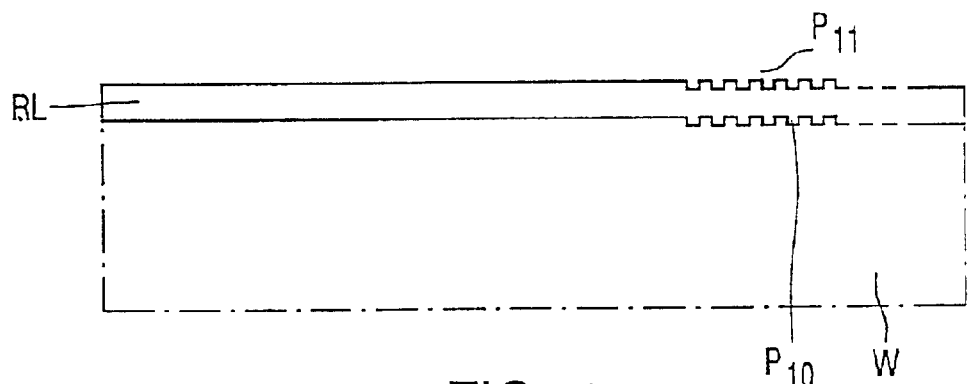
FIG. 4 shows an embodiment of a fine substrate alignment mark and an additional alignment mark provided in a substrate and a resist layer, respectively.

According to the invention, the resolving power of the method and its accuracy can be considerably increased by using a substrate alignment mark $P_{10}$ having a grating period which is considerably smaller than that of substrate alignment marks used up to now and by using an additional alignment mark $P_{11}$ arranged close to the mark, as shown in FIG. 4. This Figure shows a small part of the substrate W comprising the substrate alignment mark $P_{10}$ in a cross-section. The additional alignment mark $P_{10}$ is arranged in a resist layer RL on top of the substrate. The substrate alignment mark and the additional alignment mark have grating periods $P_{10}$ and $PE_{11}$, respectively, which are preferably of the order of the resolving power, or resolution, of the projection lens system. These grating periods are slightly different, as is illustrated in FIG. 5.

Figure 5:
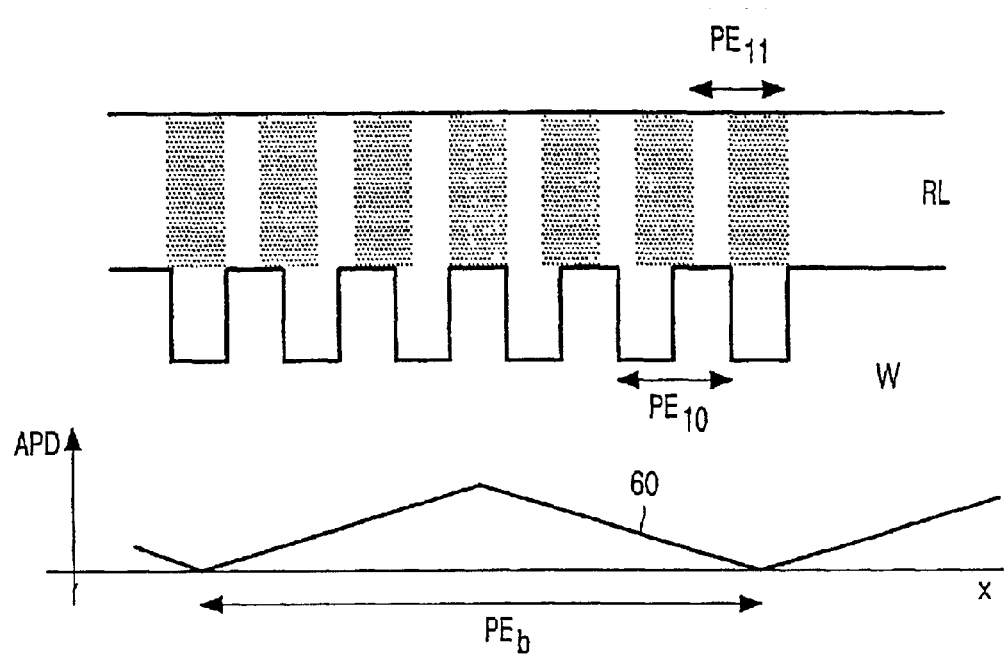
FIG. 5 is an enlarged cross-section of these marks.

The upper part of FIG. 5 shows a part of the alignment marks in a cross-section and on a very large scale. These alignment marks are constituted by phase structures, for example phase gratings. The grating period $PE_{10}$ of the substrate alignment mark is larger than this period $P_{11}$ of the additional alignment mark, or the other way round. When illuminating these alignment marks by an alignment-measuring beam, the phase effects of these marks on the beam interfere so that an interference phase pattern, or phase image is generated. This phase pattern, which may also be called a beat pattern or beat grating, has a beat period $PE_b$ which is given by:

$$1/PE_b = 1/PE_{10} - 1/PE_{11}.$$

The graph 60 in the lower part of FIG. 5 shows the variation of the average phase depth APD of the phase pattern along the x direction, i.e. perpendicular to the grating strips of the fine substrate grating and the additional alignment grating. The phase variation or the position of the maxima and minima of the beat pattern is determined by the mutual position of the fine alignment gratings. In order to measure this mutual position or the mutual shift in the X direction of the fine alignment gratings, the beat phase pattern is imaged on an on-axis or off-axis measuring grating, or measuring mark, arranged in front of a radiation-sensitive detector. If, for this imaging, an optical system is used which can resolve the coarse beat pattern with the period $PE_b$, but not the fine alignment marks with the periods $PE_{10}$ and $PE_{11}$, only the sine-like variation of the phase pattern, i.e. the position of the beat pattern will be detected. In order to determine the shift of the fine alignment marks relative to each other from the position of the beat pattern, the latter position with respect to the measuring mark can be compared with the position of the substrate mark with respect to the same measuring mark. The substrate reference mark may be constituted by a global alignment mark arranged in the substrate in the neighborhood of the fine alignment mark. The measuring mark is a mask global alignment mark in the case of an on-axis alignment device. The mutual position of the fine substrate and additional mark can be determined in a simple way from the mutual position of the reference mark and the beat pattern. A shift of the additional mark over $PE_{11}/2$ relative to the fine substrate mark results in a shift of the beat pattern over $PE_b/2$.

A small shift of the fine alignment marks is thus translated into a considerably larger shift of the beat pattern, i.e. this shift is magnified. The magnification factor $M_f$ is given by:

$$M_f = \text{shift}_{beat}/\text{shift}_{fine\ marks} = PE_{10}/(PE_{11} - PE_{10})$$

Because of the magnification, less interpolation of the detector signal is needed in the alignment signal processing, so that the measurement is more accurate. The magnification also decreases the sensitivity of the alignment method to artifacts such as PICO, RICO and WICO. Due to the magnification, the measurement of the position of the beat pattern is not very critical. If an error $\Delta$ is made in the determination of the beat pattern position this will result in a much smaller error of $(1/M_f) \cdot \Delta$ in the determination of the fine mark. The magnification factor may be of the order of 10 or 20.

Since the measuring signal is an averaged signal taken from a relatively large substrate surface area, this signal is less sensitive to local surface deformations.

The beat period $PE_b$ may be chosen to be such that it fits that of a global mask alignment mark, i.e. an on-axis alignment mark, so that the fine alignment method may be implemented with the on-axis alignment device of FIG. 3. After the choice for the beat period has been made, there is still freedom to choose the feature dimensions of the fine alignment marks, i.e. in the case of grating marks, the periods of these gratings. It is thus possible to optimize the fine substrate mark for minimum sensitivity to process-induced deformations. In the case of grating marks, this means, for example, that the grating period may be of the order of the dimensions of the IC device features, which are to be projected on the substrate by the lithographic apparatus. It is expected that grating marks with such small periods are less vulnerable to said process-induced deformations.

The substrate fine alignment mark may be a phase mark and/or an amplitude mark. In the case of a phase mark, this mark is etched in a layer of the substrate. The additional, or resist, fine alignment mark is preferably a phase mark. This mark may be constituted by a mark in a developed resist layer. The phase depth of such a mark is determined by the difference in refractive index of the resist and that of the surrounding medium, usually air, and the thickness of the resist. Since this difference in refractive index is fairly large, there is a strong relationship between the resist thickness and the signal strength of the alignment signal. The resist fine alignment mark may also be a so-called latent mark, i.e. an image of a fine alignment mark in a resist that has not been developed. Such an image comprises first areas upon which projection beam radiation has been incident and second areas for which this is not the case. These first and second areas provide different optical path lengths for the alignment-determining beam passing through them. This difference is due to either chemical changes in the first areas, which changes cause a change in the refractive index in these areas, or to material shrinkage in these areas resulting in a height difference between the first and second areas. These effects are modest and, for the usual resist thickness, no oscillatory change of the alignment signal with resist thickness will occur. Using a latent fine alignment mark provides the advantage that the substrate with the resist layer does not need to be removed from the lithographic apparatus for development of the resist.

If use is made of a latent additional alignment mark, a novel alignment strategy can be implemented. This strategy comprises the following steps:

Step 1: a substrate provided with a substrate fine alignment mark and a substrate reference mark and covered with a resist layer is arranged under the projection lens system;

Step 2: the substrate is aligned relative to the mask by imaging the substrate reference alignment mark on a non-substrate reference mark;

Step 3: an additional fine alignment mark is imaged in the resist layer on the area above the substrate fine alignment mark;

Step 4: the mutual shift of the substrate fine alignment mark and the additional alignment mark is measured by means of the method described above, the result of this measurement being an indication of an inaccuracy of the alignment device, and Step 5: use this information, i.e. a correcting factor CF, to correct the alignment.

The substrate reference alignment mark may be a global alignment mark or an alignment mark that belongs to an IC area of the substrate, and the non-substrate reference mark may be a mask global alignment mark or a mark outside the mask.

Figure 6:
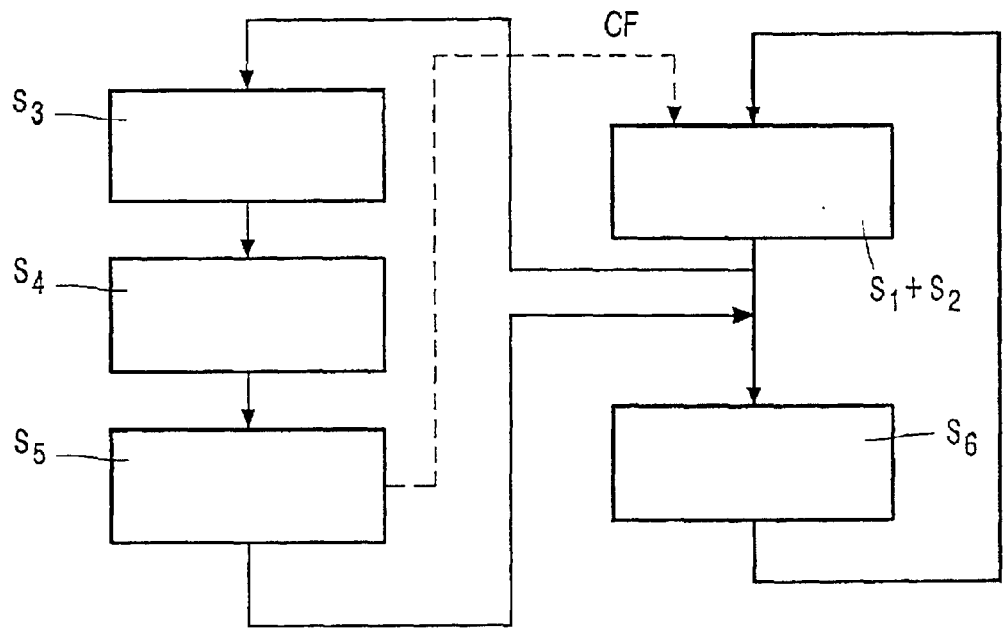
FIG. 6 shows the flow chart of a novel alignment strategy.

FIG. 6 is a flow chart of this alignment strategy wherein the steps $S_1$ to $S_5$ correspond to the above-mentioned steps. After this alignment procedure has been carried out, the wafer is exposed in the conventional way, i.e. one IC area after the other, which is step 6 in FIG. 6. The novel alignment strategy has to be carried out for only one or two wafers per batch.

The new method can be improved by using a spatial, or diffraction order, filter, or diaphragm, which transmits, for example, only the first orders sub-beams from the beat pattern. This filter may be similar to the filter 25 of FIG. 3. The sensitivity of the alignment measuring method to noise and other disturbances, which may occur in the alignment-measuring device, can be reduced considerably by such a filter. The advantage of using only the first order sub-beams for imaging the beat pattern on a mask grating is that the period of the pattern image is half that of the pattern itself, irrespective of the magnification of the projection lens system. As a result, the alignment accuracy is twice as high as in the case where the zero order sub-beam was also used for imaging.

Figure 7:
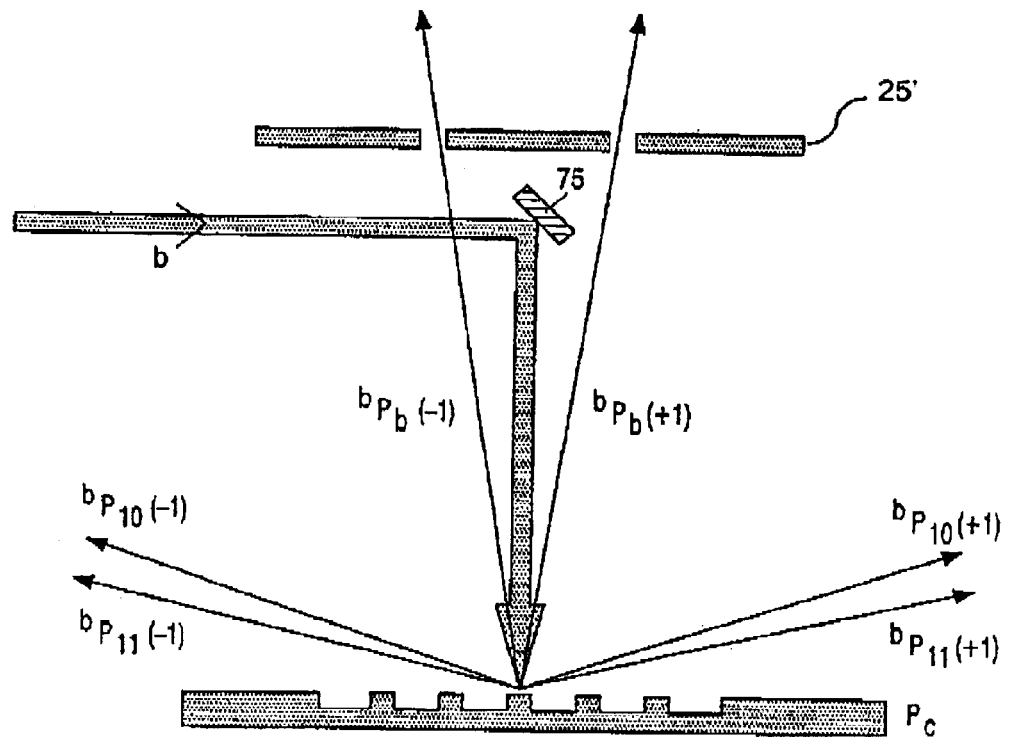
FIG. 7 shows an order filter of the on-axis alignment-measuring device and first-order sub-beams generated by the fine alignment marks.

FIG. 7 illustrates diagrammatically the method wherein an order filter 25' is used. In this Figure, b is the alignment measuring beam and 75 is a reflector which couples the beam b into the projection column comprising the projection lens system, not shown, of the lithographic apparatus. The optical axis of the projection lens system coincides with the vertical part of the path of the beam b. The substrate fine alignment mark and the additional alignment mark and the beat pattern generated by them are schematically represented by the grating structure $P_c$, which is a composite structure. The sub-beams $b_{Pb}(+1)$ and $b_{Pb}(-1)$ are the alignment beam portions which are diffracted by the grating structure in the plus first diffraction order and the minus first diffraction order, respectively. These sub-beams pass through the openings in the spatial, or order, filter to a mask alignment mark and a detector. The sub-beams of other diffraction orders are blocked by the filter and thus cannot reach the detector.

FIG. 7 also shows, for illustrative purposes, the sub-beams $b_{P10}(+1)$ and $b_{P10}(-1)$, which, in the embodiment of FIG. 5, would be diffracted in the first plus and minus first orders by the fine substrate grating $P_{10}$ alone, as well as the sub-beams $b_{P11}(+1)$ and $b_{P11}(-1)$ which would be diffracted in the plus and minus first orders by the additional fine grating $P_{11}$ alone. Due to the small periods of these fine gratings the diffraction angles are so large that these subbeams do not even enter the projection lens system. This means that the alignment device images only the beat pattern rather than an individual fine alignment mark.

The new method may also be used for two-dimensional alignment, i.e. alignment in both the X direction and the Y direction. The substrate fine alignment mark and the additional alignment mark should comprise then both grating strips extending in the Y direction and grating strips extending in the X direction, in a similar way as shown in FIG. 2 for the global alignment mark.

Instead of using the alignment device shown in FIGS. 1 and 3, the novel method can also be performed with other on-axis alignment devices.

The projection system, which is used, inter alia, for imaging the beat pattern on the mask alignment mark may not be a lens projection system but a mirror system or a system comprising lenses and mirrors. A mirror projection system will be used in an apparatus, such as an EUV apparatus, wherein the projection beam has such a small wavelength that no suitable lens material is available.

The new method may also be implemented with an off-axis alignment measuring device, for example a device by means of which the alignment of a substrate mark relative to a reference is determined and wherein higher order sub-beams, i.e. sub-beams having a diffraction order which is higher than 1, are used. Since the substrate mark alignment measuring no longer takes place through the projection system, there will be a greater freedom to use more sub-beams, particularly higher order sub-beams. Since, in general, the resolving power of the alignment-measuring device increases with an increasing order number of the sub-beams, the accuracy of the alignment measuring can be enhanced considerably. Moreover, it is also possible to use alignment-measuring radiation with more than one wavelength, so that the requirements imposed on the depth of the grating grooves can be alleviated considerably.

Figure 8:
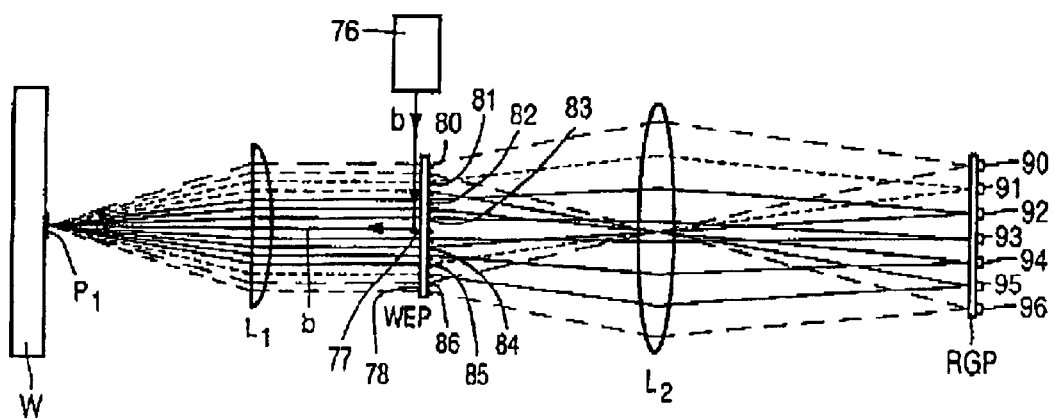
FIG. 8 shows an embodiment of an off-axis alignment-measuring device by means of which the novel alignment method can be performed.

FIG. 8 is the circuit diagram of an off-axis alignment-measuring device. In this Figure, the composite substrate grating structure, including the beat pattern, is denoted by $P_1$. A parallel alignment-measuring beam b having a wavelength $\lambda$ incident on this structure is split up into a number of sub-beams extending at different angles $\alpha_n$ (not shown) to the normal on the grating, which angles are defined by the known grating formula:

$$\sin \alpha_n = N \cdot \lambda / P$$

wherein N is the diffraction order number and P the grating period. The path of the sub-beams reflected by the composite grating structure incorporates a lens system $L_1$, which converts the different directions of the sub-beams into different positions $u_n$ of these sub-beams in a plane 78:

$$u_n = f_1 \cdot \alpha_n$$

In the plane 78, means may be provided for further separating the different sub-beams. To this end, a plate may be arranged in this plane, which is provided with deflection elements in the form of, for example wedges 81–86. In FIG. 8, the wedge plate is denoted by WEP. The wedges are provided on, for example the rear side 80 of the plate. A prism 77 can then be provided on the front side of the plate, with which the alignment-measuring beam coming from the radiation source 76, for example a He—Ne laser, can be coupled into the alignment-measuring device. This prism can also prevent the 0-order sub-beam from reaching the detectors. The number of wedges corresponds to the number of sub-beams to be used. In the embodiment shown, there are six wedges per measuring direction for the plus orders so that the sub-beams up to and including the 7-order can be used for alignment measuring. All wedges have a different wedge angle so that an optimal separation of the sub-beams is obtained.

A second lens system $L_2$ is arranged behind the wedge plate. This lens system images the grating structure Pc in a plane reference plate RGP. In the absence of the wedge plate, all sub-beams would be superimposed on the reference plate. Since the different subbeams are deflected at different angles by the wedge plate, the images formed by the subbeams are situated at different positions on the reference plate. These positions $x_n$ are given by:

$$x_n = f_2 \cdot \gamma_n$$

wherein $\gamma$ is the angle at which a sub-beam is deflected by the wedge plate and $f_2$ is the focal length of the lens system $L_2$. Reference gratings $G_{90}$–$G_{96}$ (not shown) can be provided at these positions, behind each of which a separate detector 90 to 96 is arranged. The output signal of each detector is dependent on the extent to which the image of the grating structure Pc coincides with the relevant reference grating. Hence, the extent of alignment of the substrate grating structure, and thus of the substrate, can be measured with each detector 90 to 96. However, the accuracy with which the measurement takes place is dependent on the order number of the sub-beam used; as this order number is larger, the accuracy is greater. The grating period of each reference grating is adapted to the order number of the associated sub-beam. As the order number is larger, the grating period is smaller and a smaller alignment error can be detected.

Hitherto only one set of diffraction orders has been considered. However, in addition to +1, +2, +3 etc. order sub-beams, the diffraction structure Pc also forms sub-beams of diffraction orders −1, −2, −3 etc. Both the plus-order and minus-order sub-beams can be used to form the grating image, i.e. a first image of the grating structure is formed by the +1 and −1 order jointly, a second image is formed by the +2 and −2 order sub-beams jointly, and so forth. For the +1 order and the −1 order sub-beams, no wedges need to be used, but plane-parallel plates which compensate for path-length differences can be provided at the positions of these sub-beams in the plane of the wedge plate. Thus, six wedges, both for the plus orders and for the minus orders, are required for the orders 2 to 7. Also for the alignment measuring in the Y direction, seven sub-beams may be used together with seven further reference gratings. A second series of twelve wedges is then arranged on the wedge plate in the Y direction in the embodiment of FIG. 8.

For further details and embodiments of the off-axis alignment device wherein different diffraction orders may be used, reference is made to WO 98/39689. This patent application also describes under which circumstances the different diffraction orders are used, and that alignment radiation having two wavelengths may be used in the off-axis alignment device. The latter provides the advantage that no stringent requirements have to be imposed on the groove depth of the substrate alignment marks.

With an off-axis alignment-measuring device, for example that of FIG. 8, not only the position of a substrate but also the position of the substrate holder or substrate table can be measured. To this end, the holder or table is also provided with an alignment mark similar to the global substrate alignment mark. If the position of the substrate holder with respect to the reference in the alignment-measuring device has been determined, the position of the substrate mark with respect to the substrate holder mark will be known. To be able to determine the mutual position of the mask pattern and the substrate, a further measurement is necessary, namely that of the position of the mask pattern with respect to the substrate holder or table. For this measurement, the on-axis alignment device described with reference to FIGS. 1 and 3 may be used, with which the position of a mask mark with respect to substrate holder mark is then determined. Not only the double alignment-measuring device of FIG. 3, but also a single alignment-measuring device as described in U.S. Pat. No. 4,251,160 may be used.

Another possibility of measuring the alignment of the mask pattern with respect to the substrate holder or table is the use of an image sensor device described in, for example U.S. Pat. No. 4,540,277. In such a device, a mask alignment mark is imaged by means of the projection radiation on a corresponding and transmissive reference mark in the substrate table. In this table, a detector may be arranged behind the reference mark for converting radiation passed by the reference mark into an electric signal. This image sensor device was initially intended for the calibration of an on-axis alignment device which operates with alignment radiation having a wavelength which is considerably different from that of the projection radiation, or for checking the image quality of the image formed by the projection system and for measuring distortions and aberrations which may occur. However, the image sensor is also eminently suitable for measuring the alignment of the mask pattern with respect to the substrate table. Instead of the transmission image sensor device described in U.S. Pat. No. 4,540,277, an image sensor device operating in reflection may be alternatively used for determining the alignment of a mask mark with respect to a substrate table mark. Such a device, which is described in U.S. Pat. No. 5,144,363, operates with a reflective mark on the table and comprises a relatively large numbers of detectors which observe the mark at different angles and which, together with the associated optical systems, are provided in a sensor plate arranged between the projection lens system and the substrate table.

The off-axis alignment-measuring device may be arranged in the projection column, comprising the mask holder, the projection system and the substrate holder. With the increasing demands for larger ICs having smaller device features, and thus comprising more electronic components, the alignment procedure becomes more and more time-consuming. Without further measures, the throughput of lithographic projection apparatus for manufacturing these ICs therefore tends to increase. It has already been proposed to add a separate measuring station to such apparatus. In this station the position in, for example the X, Y and Z-directions of a substrate is measured before this wafer is brought into the projection column, or projection station. In the measuring station, substrate marks can be aligned with respect to alignment marks on the substrate holder or table. After the holder with the substrate has been placed in the projection column, only a mask alignment mark needs to be aligned with respect to the substrate holder mark, which takes only a short time. As a second substrate is being measured in the separate measuring station of the apparatus comprising such a separate measuring station and a projection station, during exposure of a first substrate in the projection station, the throughput of this apparatus is considerably larger than in an apparatus without a separate measuring station. The alignment-measuring method of the present invention can be used to advantage in the measuring station.

In practice, the method of the present invention will be applied as one step in a process of manufacturing a device in at least one layer on a substrate, namely for aligning a mask pattern with respect to the substrate before imaging the mask pattern in a resist layer on said layer. After the image has been developed, material is removed from, or added to areas of said layer, which areas are delineated by the printed image. These process steps of imaging and material removing or material adding are repeated for all layers until the whole device is finished.

The invention has been described with reference to its use in an apparatus for imaging a mask pattern on a substrate for manufacturing ICs, but this does not mean that it is limited thereto. The invention may also be used in an apparatus for manufacturing integrated, or planar, optical systems, magnetic heads or liquid crystal panels. The projection apparatus may not only be an optical apparatus, in which the projection beam is a beam of electromagnetic radiation and the projection system is an optical projection lens, or mirror, system, but also in an apparatus wherein the projection beam is a charged-particle beam, such as an electron beam or an ion beam, or an X-ray beam, in which the associated projection system, for example an electron lens system, is used. Generally, the invention may be used in imaging systems with which images having very small details must be formed.

What is claimed is:

1. A method of measuring alignment of a substrate, provided with at least one substrate alignment mark having a periodic structure, with respect to a reference alignment mark having a periodic structure with a period, prior to imaging a mask pattern in a resist layer on the substrate, the method comprising:

illuminating a substrate alignment mark with an alignment beam and imaging this mark on a reference alignment mark, and determining the intensity of alignment radiation from the reference alignment mark by, using a substrate alignment mark having a periodic structure with a second period which is smaller than the first period of the reference alignment mark;

providing the resist layer with an additional alignment mark having a periodic structure with a third period such that, upon illumination by the alignment beam of the substrate alignment mark and the additional alignment mark, an interference pattern is generated having a fourth period of which is approximately equal to the first period of the reference alignment mark, and imaging the interference pattern on the reference alignment mark, wherein the interference pattern is imaged on a mask alignment mark via an optical filter, which selects diffraction order of the radiation from the substrate alignment marks to proceed to said mask alignment mark.

2. A method as claimed in claim 1, further comprising using a substrate reference mark having a fifth period substantially the same as the fourth period of interference pattern, imaging the substrate reference alignment mark on the reference alignment mark, and determining the difference between the positions of the image of the interference pattern and that of the substrate reference alignment mark with respect to the reference alignment mark.

3. A method as claimed in claim 1, further comprising using gratings for the substrate alignment mark, the additional alignment mark and the reference alignment mark.

4. A method as claimed in claim 1, wherein the additional alignment mark is a latent mark.

5. A method as claimed in claim 1, wherein the method is based on the on-axis alignment principle.

6. A method as claimed in claim 1, wherein the method is based on the off-axis alignment principle.

7. A method of aligning a substrate with respect to a mask, using a global alignment-measuring method of measuring the position of a global substrate alignment mark with respect to a global reference alignment mark, the method comprising:

providing a substrate with a substrate reference alignment mark and a substrate fine alignment mark having a period which is smaller than that of the substrate reference alignment mark, which substrate is covered with a resist layer;

aligning the substrate reference alignment mark with respect to a non-substrate reference alignment mark, using a coarse-alignment-measuring method;

providing the resist layer with an additional alignment mark having a period of the same order as that of the substrate fine alignment mark;

measuring the alignment of the substrate fine alignment mark with respect to the additional alignment mark by illuminating these two marks and imaging the resulting interference pattern on the non-substrate reference alignment mark, and using the measuring signal of this measurement to correct the signal obtained with the coarse alignment method;

wherein the interference pattern is imaged via an optical filter, which selects diffraction orders of the radiation from the illuminated marks.

8. The method of claim 7, wherein the method is based on the on-axis alignment principle.

9. The method of claim 7, characterized in that it is wherein the method is based on the off-axis principle.

10. A method of manufacturing devices in at least one layer of a substrate, comprising:

aligning a mask provided with a mask pattern comprising pattern corresponding to a device feature to be configured in said layer;

imaging, by projection radiation, the mask pattern in a radiation-sensitive layer on the substrate, and removing material from, or adding material to, areas of said layer and substrate, which areas are delineated b the mask pattern image, characterized in that wherein the alignment is carried out by an alignment-measuring method comprising illuminating a substrate alignment mark with an alignment beam and imaging this mark on a reference alignment mark having a periodic structure with a first period; and determining the intensity of alignment radiation from the reference alignment mark by;

using a substrate alignment mark having a periodic structure with a second period which is smaller than the first period of the reference alignment mark;

providing the resist layer with an additional alignment mark having a periodic structure with a third period such that, upon illumination by the alignment beam of the substrate alignment mark and the additional alignment mark, an interference pattern is generated having a fourth period which is approximately equal to the first period of the reference alignment mark; and imaging the interference pattern on the reference alignment mark;

wherein the interference pattern is imaged on a mask alignment mark via an optical filter, which selects diffraction orders of the radiation from the substrate alignment marks to proceed to said mask alignment mark.

* * * * *